United States Patent
Yamamoto et al.

(10) Patent No.: US 8,395,138 B2
(45) Date of Patent: Mar. 12, 2013

(54) NONVOLATILE SEMICONDUCTOR MEMORY HAVING BUFFER LAYER CONTAINING NITROGEN AND CONTAINING CARBON AS MAIN COMPONENT

(75) Inventors: Kazuhiko Yamamoto, Yokohama (JP); Kazuyuki Yahiro, Kawasaki (JP); Tsukasa Nakai, Hino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 413 days.

(21) Appl. No.: 12/545,326

(22) Filed: Aug. 21, 2009

(65) Prior Publication Data
US 2010/0181546 A1 Jul. 22, 2010

(30) Foreign Application Priority Data
Jan. 16, 2009 (JP) ................................. 2009-008192

(51) Int. Cl.
*H01L 47/00* (2006.01)
*H01L 29/00* (2006.01)
*H01L 29/02* (2006.01)
*H01L 29/04* (2006.01)
*H01L 29/06* (2006.01)
*H01L 31/0312* (2006.01)
*G11C 11/00* (2006.01)

(52) U.S. Cl. ............. 257/4; 257/1; 257/2; 257/3; 257/5; 257/77; 365/148

(58) Field of Classification Search .................. None
See application file for complete search history.

(56) References Cited

U.S. PATENT DOCUMENTS 5,825,046 A * 10/1998 Czubatyj et al. .................. 257/2
(Continued)

FOREIGN PATENT DOCUMENTS

JP 2008-182234 8/2008
KR 10-2008-0069430 7/2008
(Continued)

OTHER PUBLICATIONS

Main. (n.d.) The American Heritage® Dictionary of the English Language, Fourth Edition. (2003). Retrieved Jan. 24, 2012 from http://www.thefreedictionary.com/Main.*

(Continued)

*Primary Examiner* — N Drew Richards
*Assistant Examiner* — Michael Jung
(74) *Attorney, Agent, or Firm* — Oblon, Spivak, McClelland, Maier & Neustadt, L.L.P.

(57) ABSTRACT

A nonvolatile semiconductor memory using carbon related films as variable resistance films includes bottom electrodes formed above a substrate, buffer layers formed on the bottom electrodes and each formed of a film containing nitrogen and containing carbon as a main component, variable resistance films formed on the buffer layers and each formed of a film containing carbon as a main component and the electrical resistivity thereof being changed according to application of voltage or supply of current, and top electrodes formed on the variable resistance films.

13 Claims, 6 Drawing Sheets

U.S. PATENT DOCUMENTS

| | | | |
|---|---|---|---|
| 2008/0273369 | A1 | 11/2008 | Angerbauer et al. |
| 2008/0278990 | A1* | 11/2008 | Kumar et al. .............. 365/148 |
| 2009/0250682 | A1* | 10/2009 | Park et al. .................... 257/4 |
| 2010/0012912 | A1* | 1/2010 | Schricker ...................... 257/2 |
| 2010/0012914 | A1* | 1/2010 | Xu et al. ........................ 257/2 |
| 2010/0237319 | A1 | 9/2010 | Satoh et al. |
| 2011/0049463 | A1 | 3/2011 | Yamamoto et al. |
| 2011/0198556 | A1 | 8/2011 | Yamamoto et al. |
| 2011/0235395 | A1 | 9/2011 | Kobayashi et al. |

FOREIGN PATENT DOCUMENTS

| | | |
|---|---|---|
| WO | WO 2010/029634 A1 | 3/2010 |

OTHER PUBLICATIONS

P. Vettiger, et. al., "The "Millipede"—Nanotechnology Entering Data Storage", IEEE Transactions on Nanotechnology, vol. 1, No. 1, Mar. 2002, pp. 39-55.

P. Vettiger, et al., "Thousands of Microcantilevers for Highly Parallel and Ultra-Dense Data Storage", in Technical Digest, IEDM 2003, 2003, pp. 763-766.

Office Action issued May 13, 2011, in Korean Patent Application No. 10-2010-3803 with English translation.

U.S. Appl. No. 13/404,678, filed Feb. 24, 2012, Kobayashi, et al.

* cited by examiner

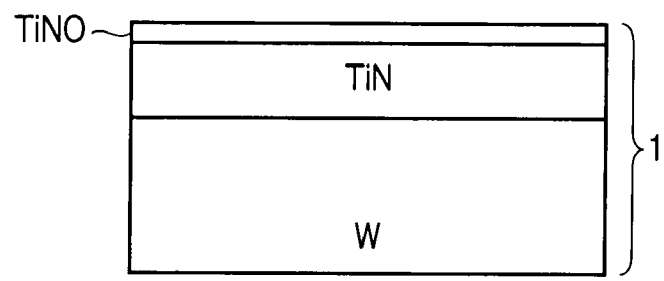
F I G. 1A
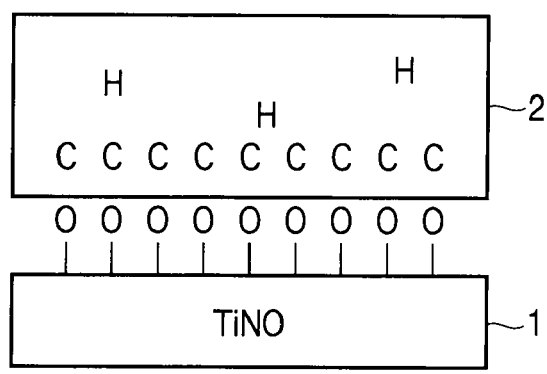
F I G. 1B
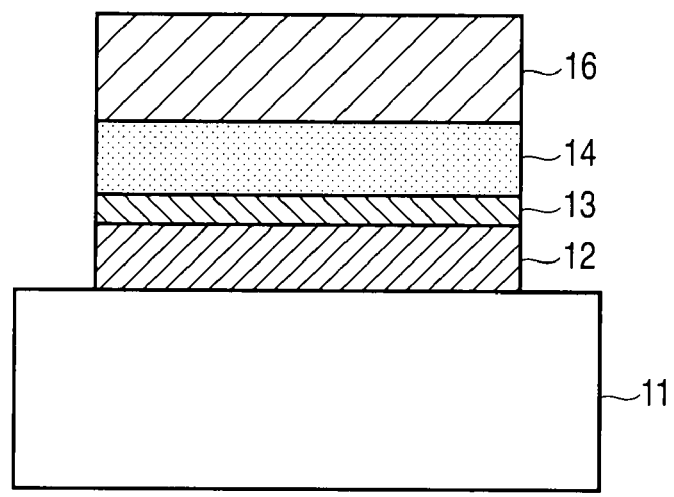
F I G. 2

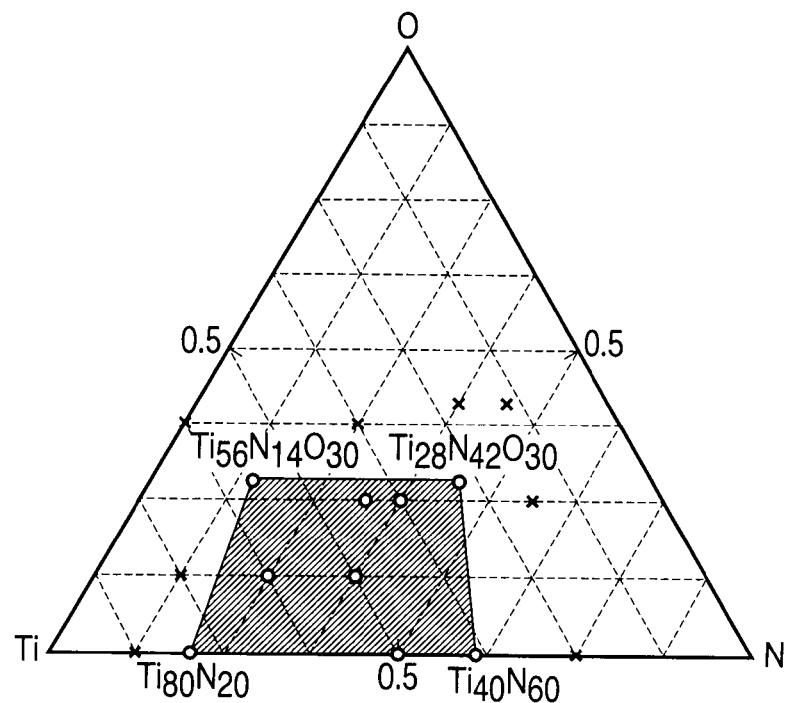
F I G. 8
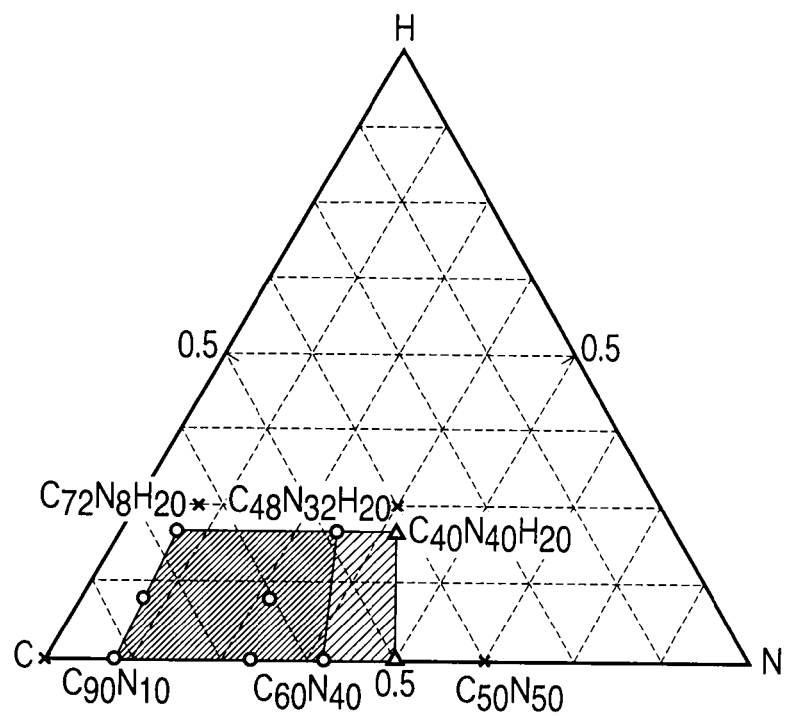
F I G. 9

NONVOLATILE SEMICONDUCTOR MEMORY HAVING BUFFER LAYER CONTAINING NITROGEN AND CONTAINING CARBON AS MAIN COMPONENT

CROSS-REFERENCE TO RELATED APPLICATIONS

This application is based upon and claims the benefit of priority from prior Japanese Patent Application No. 2009-008192, filed Jan. 16, 2009, the entire contents of which are incorporated herein by reference.

BACKGROUND OF THE INVENTION

1. Field of the Invention

This invention relates to a nonvolatile semiconductor memory using carbon-related films as variable resistance layers and a manufacturing method thereof.

2. Description of the Related Art

Recently, demand for non volatile memory devices with small size and large storage capacity has grown. Several ideas for new memory devices have been proposed to overcome the limit of conventional memory devices in terms of the storage capacity.

Among them, a nonvolatile semiconductor memory using a variable resistance material having different resistive states, low and high resistance states, has much attention as is disclosed in document 1 (IEEE Trans. Nanotechnology 1, 39(2002)) and document 2 (Technical Digest, IEDM03 pp. 763-766).

The memory of this type generally includes a variable resistance layer and electrodes disposed to sandwich the variable resistance layer. The variable resistance layer can take two or more different electrical resistance states and the resistance state is changed by applying a voltage pulse between the electrodes, applying a preset threshold voltage or passing a threshold current. Therefore, data can be recorded by changing the resistance state of the variable resistance layer and setting a difference in the resistance in correspondence to the data. Further, data has a characteristic that it can be read in a nondestructive fashion.

As a material of a variable resistance type nonvolatile semiconductor memory developed at present, a metal oxide, for example, a multi-component oxide such as a nickel oxide (NiO) or strontium-zirconium oxide ($SrZrO_3$) is often used. However, the physical and electrical characteristics of the metal oxide are unstable and less reproducible since it is generally difficult to form a metal oxide film with well-controlled composition and crystal structures.

On the other hand, studies on manufacturing methods and materials as candidates for the variable resistance-layer have been carried out for carbon related materials containing carbon nanotubes or fullerene. The above materials are each formed of a single carbon element, and therefore, advantages with the materials are that the composition can be relatively easily controlled and the process thereof can be easily stabilized. However, in a nonvolatile semiconductor memory using the carbon related material as a variable resistance layer, since the adhesion of the variable resistance layer on the bottom electrode is not good enough, there occurs a problem that the variable resistance layer may be separated or peeled off from the bottom electrode due to the film stress thereof.

BRIEF SUMMARY OF THE INVENTION

According to one aspect of the present invention, there is provided a nonvolatile semiconductor memory comprising bottom electrodes formed on a substrate, first buffer layers formed on the bottom electrodes, the buffer layer being formed of a film containing nitrogen and containing carbon as a main component, variable resistance films formed on the first buffer layers, the variable resistance film being formed of a film containing carbon as a main component and electrical resistivity thereof being changed according to one of application of voltage and supply of current, and top electrodes formed on the variable resistance films.

According to another aspect of the present invention, there is provided a manufacturing method of a nonvolatile semiconductor memory comprising forming bottom electrodes on a substrate, forming buffer layers each formed of a film containing nitrogen and containing carbon as a main component on the bottom electrodes, forming variable resistance films on the buffer layers, the variable resistance film being formed of a film containing carbon as a main component and electrical resistivity thereof being changed according to one of application of voltage and supply of current, and forming top electrodes on the variable resistance films.

According to a further aspect of the present invention, there is provided a manufacturing method of a nonvolatile semiconductor memory comprising forming bottom electrodes on a substrate, removing oxygen components on surfaces of the bottom electrodes by performing one of a process of subjecting the bottom electrodes to thermal treatment in a reduction atmosphere and a process of exposing the bottom electrodes to a plasma atmosphere, forming variable resistance films on the bottom electrodes that are subjected to the oxygen component removing process, the variable resistance film being formed of a film containing carbon as a main component and electrical resistivity thereof being changed according to one of application of voltage and supply of current, and forming top electrodes on the variable resistance films.

BRIEF DESCRIPTION OF THE SEVERAL VIEWS OF THE DRAWING

FIGS. 1A and 1B are schematic views showing states in which water and a hydroxyl group are formed when a variable resistance layer is formed on a bottom electrode, for illustrating the principle of this invention.

FIG. 2 is a cross-sectional view showing the element structure of a variable resistance element (nonvolatile semiconductor memory) according to a first embodiment.

FIG. 8 is a diagram showing a desirable composition range of a titanium nitride surface.

FIG. 9 is a diagram showing a desirable composition range of a nitrogen-doped carbon film.

DETAILED DESCRIPTION OF THE INVENTION

Figure 3:
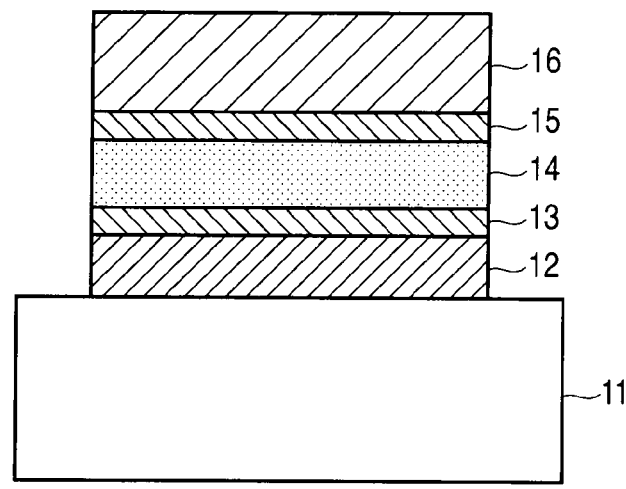
FIG. 3 is a cross-sectional view showing the element structure of a variable resistance element (nonvolatile semiconductor memory) according to a second embodiment.

Before explaining embodiments of the present invention, the basic principle of this invention will be described.

First, a case wherein a carbon related variable resistance layer is formed on an electrode is considered. As shown in FIG. 1A, as an electrode 1, a TiN film formed on a semiconductor substrate of silicon, for example, is used. At this time, oxidation of the surface of the TiN film due to oxygen in the atmosphere cannot be avoided and a TiNO film will be formed on the TiN film. Therefore, when a variable resistance layer is formed on the electrode 1, the variable resistance layer is adhered to the TiNO film of the electrode 1 as shown in FIG. 1B.

The carbon related layer 2 is formed by use of a general CVD method or the like. A material used at this time is a hydrocarbon related gas and the constituent element contains carbon (C) and hydrogen (H) atoms. Carbon related materials have high water absorbability and film becomes unstable with time due to adsorption of hydrogen, water, hydroxyl group (OH group) or the like. Further, as the carbon related material is combined with oxygen adsorbed on the electrode, the adhesion between the carbon related material and the electrode becomes bad, which forms gaps therebetween, creating a problem that the variable resistance characteristic becomes unstable. There also occurs a problem that the film properties becomes unstable due to impurity reconfiguration in the film by applying electric field with voltage supply or Joule heating with passing the current into the carbon related film.

When the variable resistance layer 2 is formed in directly deposited on the electrode 1, oxygen, —OH group contained in the TiNO film surface of the electrode 1 react with hydrogen atoms contained in the variable resistance layer 2 or hydrogen atoms later supplied into the variable resistance layer 2 in the post process steps. As a result, water and hydroxyl group may be formed on the contact interface between the variable resistance layer 2 and the electrode 1. It is predicted that the water and hydroxyl group will degrade the adhesion between the variable resistance layer 2 and the electrode 1.

Therefore, the inventors of this application eagerly studied to suppress the occurrence of a reaction between hydrogen in the variable resistance layer and oxygen in the electrode. As a result, it is found that it is effective to dispose a buffer layer that is unreactive with hydrogen and oxygen between the variable resistance layer and the electrode in order to suppress occurrence of a reaction between hydrogen in the variable resistance layer and oxygen in the electrode. Further, it is found that it is effective to reduce the amount of oxygen of the electrode surface before the variable resistance layer is formed.

That is, the combination between hydrogen contained in the variable resistance layer and oxygen contained in the electrode can be suppressed by disposing a buffer layer containing nitrogen and having carbon as a main component between the variable resistance layer and the electrode. As a result, film separation can be suppressed. Further, hydrogen contained in the variable resistance layer and oxygen contained in the electrode can be further suppressed from being combined by reducing the oxygen concentration in the electrode and, as a result, film separation can be suppressed.

Now, embodiments of this invention based on the above principle are explained in detail with reference to the accompanying drawings.

(First Embodiment)

FIG. 2 is a cross-sectional view showing the element structure of a variable resistance element (nonvolatile semiconductor memory) according to a first embodiment of this invention. Symbol 11 in FIG. 2 denotes a substrate, 12 a bottom electrode, 13 a first buffer layer, 14 a variable resistance layer, and 16 a top electrode. The basic structure is the same as the conventional structure, but in this embodiment, the buffer layer 13 is formed between the variable resistance layer 14 and the bottom electrode 12 in addition to the conventional structure.

The bottom electrode 12 and top electrode 16 may be formed of a conductive material and it is sufficient if the resistance thereof is lower than that of the buffer layer 13 and variable resistance layer 14. When a voltage is applied between the bottom electrode 12 and the top electrode 16, the applied voltage is divided according to the resistances thereof. At this time, if the electrical resistances of the buffer layer 13 and variable resistance layer 14 are high, a voltage is applied between the buffer layer 13 and the variable resistance layer 14 so that the resistance change operation can be performed.

More preferably, the electrical resistance of the buffer layer 13 is desirably set lower than that of the variable resistance layer 14. If the electrical resistivity of the buffer layer 13 is set lower than that of the variable resistance layer 14 and the buffer layer 13 and variable resistance layer 14 are formed with the same film thickness, most of the applied voltage is applied to the variable resistance layer 14. In this case, the resistance change operation can be easily performed. If the film thickness of the buffer layer 13 is smaller than that of the variable resistance layer 14 and the buffer layer 13 and variable resistance layer 14 have the same electrical resistivity, most of the applied voltage is applied to the variable resistance layer 14. Also, in this case, the resistance change operation can be easily performed.

The bottom electrode 12 and top electrode 16 are each formed of a conductive metal such as titanium, zirconium, hafnium, tantalum, tungsten, aluminum, silicon, ruthenium, iridium or platinum, or an alloy or nitride thereof.

When a noble metal material is used, it is difficult to perform a reactive ion etching process or wet removal process and the cost thereof is high. Therefore, generally, it is easy and preferable to use titanium, zirconium, hafnium, tantalum, tungsten, aluminum, silicon or a nitride thereof. However, it is of course possible to operate the element even if a noble metal material is used.

As the variable resistance layer 14, a material containing carbon may be used. For example, it may be formed of a mixture of a graphite component of a minute grain size and so-called formless carbon in which the crystal structure having no long order is disturbed or amorphous carbon.

Part, or all of the graphite component may be formed of a carbon nano-material. As the carbon nano-material, a steric structure of a minute nano-order scale containing fullerene or carbon nanotube of a single wall, double wall or multi wall may be used.

The electrical resistance of the variable resistance layer 14 has two or more different states that can be reversibly changed. More specifically, a voltage not lower than threshold voltage is applied between, a current not smaller than a threshold current is passed through, or charges not smaller than threshold charges are injected through the bottom electrode 12 and top electrode 16. As a result, the electrical resistance of the variable resistance layer 14 is changed from a certain state selected from the above two or more states into another state. For example, if a voltage not lower than the threshold voltage, current flow not smaller than the threshold current or charges not smaller than the threshold charges are supplied, the electrical resistance is changed to the high-resistance state when it is set in the low-resistance state or changed to the low-resistance state when it is set in the high-resistance state.

The principle to attain the above effect is not clear, and there occurs the possibility that the crystal state of the carbon film may vary according to the supply of voltage, current or a charge. For example, it may be changed from the amorphous state to the crystallized state or a bond of carbon atoms may be changed from an sp2 bond to an sp3 bond.

The buffer layer 13 is a carbon film containing nitrogen as a material. Due to the presence of the buffer layer 13, the adhesion between the bottom electrode 12 and the variable resistance layer 14 is enhanced and an optimum variable resistance characteristic is obtained. Further, the resistance to deterioration due to repetitive resistance changes increases and the element reliability is enhanced. It is desirable to set the ratio of nitrogen contained in the carbon film to 10 atomic % or more. If the ratio is set to 10 atomic % or more, it functions as a buffer layer as will be described below. Further, preferably, it may be set to 50 atomic % or less. Since the electrical resistivity increases as the composition ratio of nitrogen becomes higher, the electrical resistance becomes high and there occurs a possibility that a sufficiently high voltage will not be applied to the variable resistance layer. However, in this case, the buffer layer 13 may be formed thin.

The bottom electrode 12 is a conductive metal film, but water or oxygen in the atmosphere is adsorbed on the outermost surface after the conductive metal film is deposited. Further, the surface is oxidized or the surface is covered with a hydroxyl group in the wet cleaning process.

The carbon film used as the variable resistance layer 14 contains hydrogen. Hydrogen may be easily introduced into the film in various processes in a hydrogen atmosphere in the semiconductor process. The processes in the hydrogen atmosphere include (1) a process of depositing and forming a carbon film by a chemical vapor deposition method, (2) a process of cleaning the carbon film by performing the wet cleaning process, (3) a process of cleaning the same by a residual process after dry etching and (4) a hydrogen thermal treatment process of stabilizing the characteristic of a drive transistor associated with the element.

With the structure of this embodiment, the reaction of oxygen contained in the bottom electrode 12 with hydrogen contained in the variable resistance layer 14 and formation of volatile water ($H_2O$) can be suppressed due to the presence of the buffer layer 13 inserted between the bottom layer 12 and the variable resistance layer 14. As a result, it becomes possible to previously prevent the bottom layer 12 and variable resistance layer 14 from being separated or peeled off and the reliability can be enhanced.

Further, since the buffer layer 13 contains nitrogen, impurities contained in the bottom layer 12 and variable resistance layer 14 can be prevented from being diffused and reacting with each other. As a result, the bottom layer 12 and variable resistance layer 14 can be prevented from being separated. If the bottom layer 12 and variable resistance layer 14 are not separated, a sufficiently high voltage or a large amount of current can be applied to and a sufficiently large amount of charges can be injected into the variable resistance layer 14, and therefore, the resistance change operation can be maintained for a long period. More preferably, it is desirable to set the oxygen concentration of the surface of the bottom electrode 12 low and the oxygen concentration of the bottom electrode 12 is preferably set to 30 atomic % or less.

(Second Embodiment)

FIG. 3 is a cross-sectional view showing the element structure of a variable resistance element (nonvolatile semiconductor memory) according to a second embodiment of this invention. In this embodiment, parts that are the same as those of FIG. 1 are denoted by the same symbols and the detailed explanation thereof is omitted.

This embodiment is different from the first embodiment explained above in that not only the buffer layer is inserted between the variable resistance layer 14 and the bottom electrode 12 but also a buffer layer 15 is inserted between the variable resistance layer 14 and the top electrode 16. That is, the buffer layer 13 is formed between the variable resistance layer 14 and the bottom electrode 12 and the buffer layer 15 is formed between the variable resistance layer 14 and the top electrode 16. The buffer layer 15 may be formed of the same material as that of the buffer layer 13.

With the above structure, it is of course possible to attain the same effect as that of the first embodiment, and separation between the variable resistance layer 14 and the bottom electrode 16 can be prevented and the reliability can be further enhanced.

(Third Embodiment)

Figure 4:
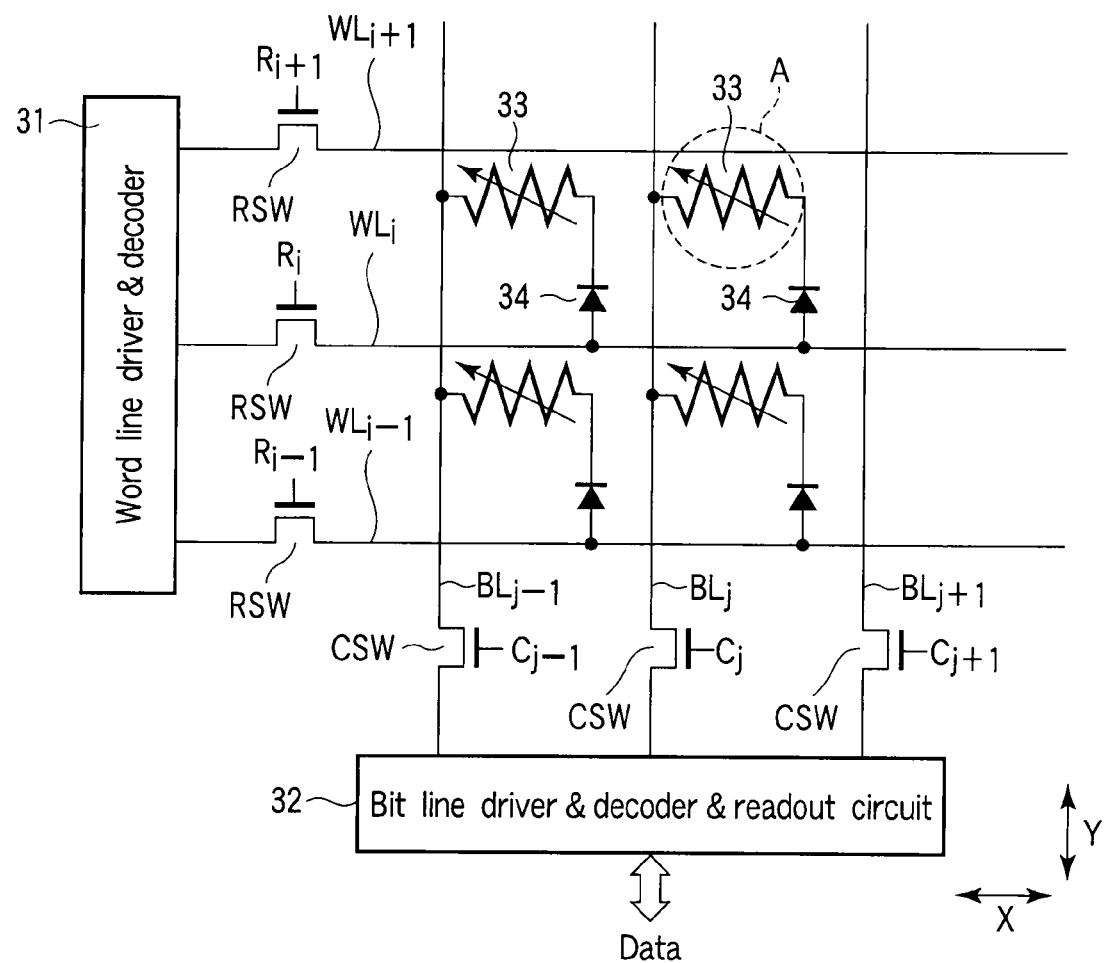
FIG. 4 is a diagram showing the circuit configuration of a cross-point type nonvolatile semiconductor storage device according to a third embodiment.

FIG. 4 is a diagram showing the circuit configuration of a cross-point type nonvolatile semiconductor storage device according to a third embodiment of this invention.

A plurality of word lines WL (WLi−1, WLi, WLi+1) and a plurality of bit lines BL (BLj−1, BLj, BLj+1) are arranged in parallel, the word lines WL extend in an X direction and the bit lines BL extend in a Y direction. In FIG. 4, only three word lines and bit lines are shown, but in practice, a larger number of word lines WL and bit lines BL are arranged.

One-side ends of the word lines WL are connected to a word line driver & decoder 31 via MOS transistors RSW acting as selection switches. One-side ends of the bit lines BL are connected to a bit line driver & read circuit 32 via MOS transistors CSW acting as selection switches.

The gates of the MOS transistors RSW are respectively supplied with selection signals R (Ri−1, Ri, Ri+1) used to select one word line (row). The gates of the MOS transistors CSW are respectively supplied with selection signals C (Cj−1, Cj, Cj+1) used to select one bit line (column).

Memory cells are arranged in intersecting portions between the respective word lines WL and bit lines BL. That is, a so-called cross-point type cell array structure in which memory cells 33 are arranged in intersecting portions between the respective word lines WL and bit lines BL is formed. The memory cell 33 is formed by use of a variable resistance material like the first embodiment and a diode 34 for preventing a sneak current at the recording/playback time is connected in series with the memory cell 33.

Figure 5:
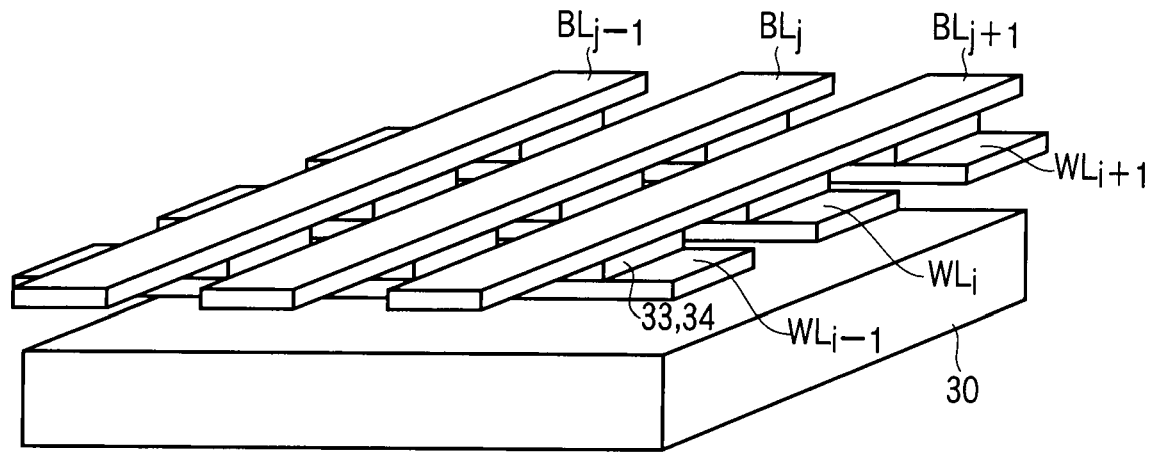
FIG. 5 is a perspective view showing the structure of a cell array portion of a memory used in the nonvolatile semiconductor storage device of the third embodiment.

FIG. 5 shows the structure of a memory cell array portion used in the nonvolatile semiconductor storage device of FIG. 4.

Word lines WL and bit lines BL are arranged on a semiconductor substrate 30 and memory cells 33 and diodes 34 are arranged in intersecting portions between the respective lines. The feature of the cross-point cell array structure is that it is advantageous in enhancing the integration density since it is unnecessary to connect MOS transistors to the respective memory cells 33.

Figure 6:
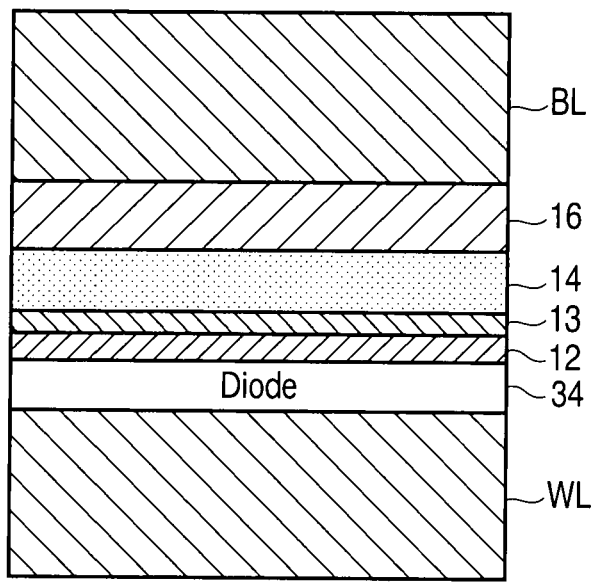
FIG. 6 is a cross-sectional view showing the structure of a memory cell used in the nonvolatile semiconductor storage device of the third embodiment.

For example, as shown in FIG. 6, the memory cell is configured by arranging a stack structure of a bottom electrode 12, buffer layer 13, variable resistance layer 14 and top electrode 16 between the word line WL and the bit line BL. One-bit data is stored in one memory cell. The diode 34 is arranged between the word line WL and the memory cell. It is rather preferable to omit the diode 34 when the set/reset operation is changed only by the direction of voltage.

[Write/Erase/Read Operations]

Next, the write/erase/read operations of the semiconductor storage device of this embodiment are explained with reference to FIG. 4 to FIG. 6. In this case, it is supposed that a memory cell surrounded by the dotted lines A in FIG. 4 is selected and the write/erase/read operations for the selected memory cell are performed.

Since the write operation (set operation) is performed by applying a voltage to the selected memory cell to cause a potential gradient in the memory cell and pass an electric pulse therethrough, for example, the potential of the word line WLi is set higher relative to the potential of the bit line BLj. If the bit line BLj is set at a fixed potential (for example, ground potential), a positive potential may be applied to the word line WLi.

Further, it is preferable to bias all of the non-selected word lines WLi−1, WLi+1 and non-selected bit lines BLj−1, BLj+1 to the same potential at the write time. At the standby time before writing, it is preferable to precharge all of the word lines WLi−1, WLi, WLi+1 and all of the bit lines BLj−1, BLj, BLj+1.

In the erase operation (reset operation), due to the Joule heat generated by passing a large current pulse through the selected memory cell and the residual heat thereof, an application voltage or current energy itself is used. For this purpose, for example, the potential of the word line WLi is set higher relative to the potential of the bit line BLj. If the bit line BLj is set at a fixed potential (for example, ground potential), a positive potential may be given to the word line WLi.

At this time, in the selected memory cell surrounded by the dotted lines A, a change occurs in a direction opposite to that in the case of the recording state and the state is returned to the original state again. As a result, the memory cell is changed from the low-resistance state to the high-resistance state and the reset operation (erase) is completed.

The read operation is performed by passing a current pulse through the selected memory cell surrounded by the dotted lines A and detecting the resistance of the memory cell. However, it is required to set the current pulse to such a small value that a material configuring the memory cell will not cause a resistance variation.

For example, a read current (current pulse) generated by the read circuit is passed from the bit line BLj through the memory cell surrounded by the dotted lines A and the resistance of the memory cell is measured by the read circuit.

[Manufacturing Method of Variable resistance Element]

In order to manufacture a variable resistance element of the memory cell portion, a bottom electrode 12 is formed on a substrate and a carbon film containing nitrogen is deposited as a buffer layer 13 on the bottom electrode 12. Then, a carbon film is formed as a variable resistance layer 14 on the buffer layer 13 and an top layer 16 is formed on the variable resistance layer 14. In this case, another layer or structure may be formed between the substrate and the bottom electrode 12. For example, a transistor or diode may be formed between the substrate and the bottom electrode 12.

In the variable resistance memory cell manufacturing method, it is desirable to remove oxygen atoms on the surface of the bottom electrode 12 before deposition of the buffer layer 13. This is because $H_2O$ is formed and the adhesion is extremely lowered if oxygen on the surface of the bottom electrode 12 reacts with hydrogen contained in the carbon film (variable resistance film) 14 deposited on the top layer.

The oxygen atoms on the surface of the bottom electrode 12 can be removed by performing a thermal treatment in a reduction atmosphere. Specifically, the thermal treatment is performed at temperatures of 400° C. or higher in a reduction gas atmosphere containing hydrogen or ammonium. Hydrogen generated by thermal decomposition reacts with the oxygen atoms on the surface of the bottom electrode 12 and is removed and impurities containing oxygen generated on the surface of the bottom electrode 12 are removed.

Further, oxygen of the bottom electrode 12 may be efficiently removed by exciting hydrogen, helium, argon, nitrogen or a mixture of the above gases by plasma discharging or UV light application to create radicals and reacting the same more reactively.

More preferably, it is preferable to continuously perform the formation process of the bottom electrode 12 and the formation process of the buffer layer 13 and variable resistance layer 14 in a vacuum. More specifically, it is desirable to perform a process from the formation process of the bottom electrode 12 to the formation process of the top electrode 16 with the degree of vacuum of $1 \times 10^{-3}$ Torr or less. As a result, adsorption of oxygen formed by exposing the electrode to air can be prevented by holding the same in a vacuum and oxygen can be easily removed by setting the concentration low. Further, the respective processes may be performed while the device is held in an environment filled with an inert gas controlled to have a low residual oxygen concentration. That is, it is important to prevent oxidization of the surface of the bottom electrode 12 as much as possible.

Subsequently, a carbon film doped with nitrogen is formed as the buffer layer 13 on the bottom electrode 12. For the film formation method, a CVD method, sputtering method, pulse laser method or the like may be used.

When the CVD method is used, a hydrocarbon related gas such as propylene ($C_3H_6$) or acetylene ($C_2H_2$) is used as a reactive gas and simultaneously supplied together with nitrogen to the wafer surface heated under vacuum. Further, in order to promote decomposition of the reactive gas, the plasma CVD method using plasma may be performed. It is preferable to set wafer temperatures to 400° C. or higher in order to decompose the reactive gas and efficiently introduce nitrogen.

When the sputtering method is used, a carbon target is used for sputtering in a high vacuum containing a mixture of argon and nitrogen. The composition of nitrogen can be controlled by changing the mixture ratio of argon to nitrogen flow.

Next, a carbon film used as the variable resistance layer 14 is formed on the buffer layer 13. For the film formation method, a CVD method, sputtering method, pulse laser method or the like may be used. When the CVD method is used, a hydrocarbon related gas such as propylene ($C_3H_6$) or acetylene ($C_2H_2$) used as a reactive gas is supplied to the wafer surface heated under vacuum to deposit a carbon film. Further, in order to promote decomposition of the reactive gas, the plasma CVD method using plasma may be performed. It is desirable to set wafer temperatures to 300° C. or higher in order to decompose the reactive gas. In this case, since a hydrocarbon related gas is used, hydrogen of approximately 0.01 atomic % to 20 atomic % remains in the carbon film although this differs depending on the film formation conditions.

When the sputtering method is used, a carbon target is sputtered in an argon atmosphere under high vacuum. When the film is formed by sputtering, the feature that hydrogen is not contained immediately after film formation is attained since hydrogen is not used in the sputtering process.

The carbon film obtained immediately after the sputtering film formation does not contain hydrogen, but generally, when a minute memory cell is formed, hydrogen will be introduced in a reactive etching process or a cleaning process performed after this. As a result, the oxygen atoms of the bottom electrode 12 reacts with hydrogen newly introduced on the carbon film to prevent the variable resistance operation. Therefore, even if the sputtering film is used, an improvement effect can be obtained by sandwiching the buffer layer 13.

The electrical resistivity of the carbon film depends on the film formation condition, generally becomes higher as the film is formed at lower temperatures and becomes lower by additionally performing the thermal treatment. In order to attain a desirable resistance of the variable resistance element, the thermal treatment may be performed in an inert gas atmosphere after film formation of the carbon film.

Finally, an top electrode 16 is formed above the variable resistance layer 14 to sandwich the buffer layer 15. The buffer layer 15 may be formed by the same method for the buffer layer 13.

When the amount of oxygen contained in the top electrode material is small, particularly, when it is 30 atomic % or less, the buffer layer 15 formed under the top electrode 16 is not necessarily formed. This is because hydrogen contained in the carbon layer acting as the variable resistance layer 14 does not react with oxygen of the top electrode 16 to such an extent that the film separation will occur.

[Conclusion]

According to the nonvolatile semiconductor storage device using the above nonvolatile semiconductor memory, it is of course possible to realize high-density recording by using the variable resistance layer containing carbon as a main component and reduce the oxygen concentration in the interface between the variable resistance layer and the respective electrodes. As a result, the adhesion between the variable resistance layer and the electrode can be enhanced and the film separation between them can be prevented. Therefore, the reliability of the device can be extremely enhanced as an element. In this embodiment, only the nonvolatile semiconductor storage device is explained, but the material and principle proposed in this embodiment can be applied to recording media such as current hard disks and DVDs.

Next, this invention is explained in more detail with reference to embodiments. However, this invention is not limited to the following embodiments.

(Embodiment 1)

Figure 7A:
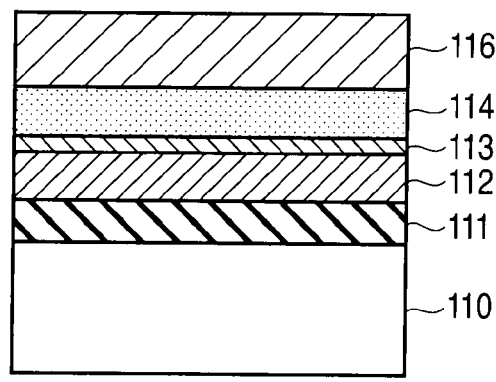
FIGS. 7A to 7C are cross-sectional views showing manufacturing steps of the variable resistance element of the structure of FIG. 2, for illustrating a concrete embodiment.
Figure 7B:
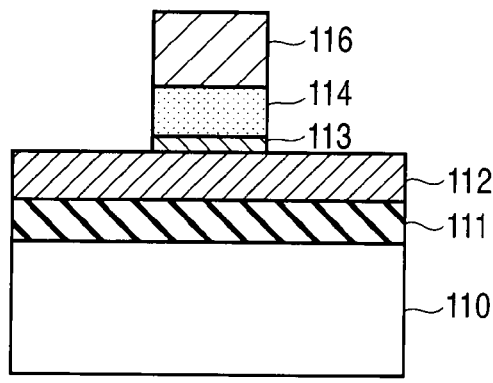
Figure 7C:
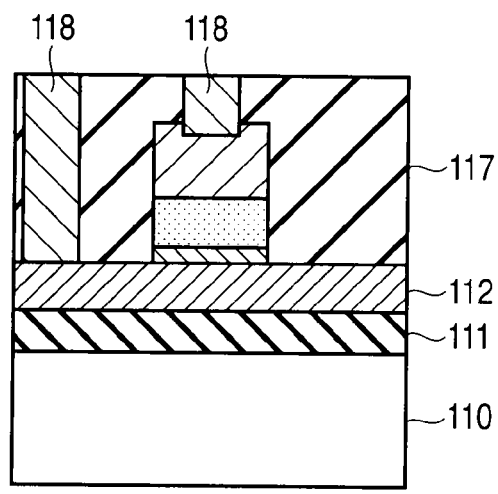

FIGS. 7A to 7C are cross-sectional views showing manufacturing steps of the variable resistance element of the structure shown in FIG. 2.

First, as shown in FIG. 7A, a silicon oxide film 111 is deposited to 200 nm on a silicon substrate 110. Then, a titanium film of 5 nm and titanium nitride film of 10 nm are formed on the silicon oxide film 111. Further, a tungsten film of 50 nm and titanium nitride film of 10 nm are laminated and deposited and the above films are used as a bottom electrode 112.

The silicon oxide film 111 is formed by using TEOS (tetraethoxysilane: $Si(OC_2H_5)_4$)) as a material by a low-pressure CVD method. The silicon oxide film 111 may be formed by another film formation method or thermal oxidation method. The reason why the silicon oxide film 111 is formed is to prevent the silicon substrate 110 and bottom electrode metal reacting with each other and grow abnormally to cause defects.

Further, titanium is used to enhance the adhesion between the titanium nitride film and the silicon oxide film and make it difficult to peel off the films. The film thickness of the titanium nitride film is freely determined, but it is preferable to set the film thickness to 5 nm or more. If it is set 5 nm or less, there is a strong possibility that titanium nitride is island growth and it is not flat in an atomic level. Further, since the adhesion is lowered due to stress of the film when the film thickness increases, it is desirable to set the film thickness to 50 nm or less.

The tungsten film is part of the bottom electrode 112 and a film thickness of 20 nm or more is required in order to greatly etch an interlayer film deposited on the bottom electrode 112 and form a contact when the bottom electrode 112 is connected to an upper pad.

The titanium nitride film formed on the tungsten film is a bottom electrode that is formed in contact with the variable resistance film and influences the variable resistance characteristic. In this embodiment, a titanium nitride film is given as an example, but titanium, zirconium, hafnium, tantalum, tungsten, aluminum, silicon, ruthenium, iridium or platinum, or an alloy or nitride thereof may be used.

FIG. 8 shows a desirable composition range in a case where the bottom electrode surface is titanium nitride. Titanium nitride is oxidized by residual oxygen by exposing the same to air after film formation or setting the same in a low vacuum (for example, $1\times10^{-3}$ Torr or more) while it is being fed in a vacuum chamber and the outermost surface of the film is oxidized and converted into titanium oxynitride. At this time, if an oxygen film adsorbed on the bottom electrode is present and a carbon film is deposited thereon, it reacts with hydrogen to lower the adhesion as described before.

In the range shown in FIG. 8, a preferable characteristic can be attained with the adhesion kept unchanged. The composition of titanium nitride is not suitable for an electrode since the electrical resistance thereof increases if the nitrogen concentration becomes 60 atomic % or more. Further, if the nitrogen concentration becomes 20 atomic % or less, titanium in the bottom electrode diffuses into the top and bottom layers to make the composition of the laminated structure unstable, and therefore, it is not suitable. More preferably, the nitrogen composition of titanium nitride is desirably set to 40 atomic % or more and 60 atomic % or less. The composition of oxygen is desirably set to 30 atomic % or less. In this range, a low-resistance electrode can be obtained, the film structure becomes stable and the adhesion is not lowered.

Next, in order to form a buffer layer 113, a carbon film of 2 nm doped with nitrogen is deposited by using the low-pressure CVD method. For deposition, a source gas of propylene ($C_3H_6$) is supplied by using helium gas (He) as a carrier gas and, at the same time, nitrogen gas is supplied for doping. At this time, the wafer temperature is set at 500° C. and plasma discharge power is set at 1000 W. Further, before deposition, a plasma process is performed in a He or nitrogen atmosphere and the oxide layer formed on the surface of the bottom electrode 112 is reduced or removed. It is preferable to set the film thickness to not less than 2 nm and not more than 10 nm. This is because the effect as a buffer layer can be attained if the film thickness is not less than 2 nm, and a higher voltage applied to the element is required if the film thickness is much thicker.

FIG. 9 shows a desirable composition range of a nitrogen-doped carbon film. The ratio of nitrogen contained in the carbon film is desirably set to 10 atomic % or more. If it is not less than 10 atomic %, the carbon film may function as a buffer layer as described below. Further, the upper limit thereof is preferably set to 50 atomic % or less. Since the electrical resistivity increases if the composition ratio of nitrogen becomes high, there occurs a possibility that the electrical resistance becomes high and a sufficiently high voltage cannot be applied to the variable resistance film. In this case, the film thickness of the buffer layer 113 may be reduced. Further, it is preferable to set the film composition less than 40%. If the film composition is less than 40%, the resistance can be further reduced. If the residual amount of hydrogen is 20 atomic % or less, the characteristic of the film can be stabilized, although this depends on the film formation conditions. If the residual amount of hydrogen is 20 atomic % or more, the adhesion is lowered by a reaction with the oxide film of the bottom electrode when the oxidation amount of the bottom electrode is not less than 30 atomic %.

In this embodiment, an example of film formation by using the CVD method is given, but a sputtering method can be used. When film formation is performed by use of the sputtering method, film formation is performed by sputtering a carbon target formed of graphite or the like in an atmosphere containing a mixture of argon and nitrogen.

Next, a carbon film of 50 nm is deposited by use of the low-pressure CVD method in order to form a variable resistance layer 114. For deposition, a source gas of propylene ($C_3H_6$) is supplied by using helium gas (He) as a carrier gas. At this time, the wafer temperature is set at 500° C. and plasma discharge power is set at 300 W. It is preferable to set the film thickness to not less than 20 nm and not more than 100 nm. When the thickness is thin less than 20 nm, excessively high current flows, and followed by broken the device. On the other hand, when the thickness is above 100 nm, the applied voltage and/or current flow is not enough to change the resistance.

In the CVD method, a hydrocarbon gas is often used as a reactive gas, but in this case, hydrogen remains in the film, depending on the film formation conditions. The residual amount of hydrogen may be preferably set in a range not higher than 20 atomic % although it depends on the film formation conditions. This is because a reaction with the oxidized bottom electrode tends to proceed, the adhesion is lowered and the reliability of the element is deteriorated if the hydrogen content is large.

In this embodiment, an example of film formation by the CVD method is given, but a sputtering method can be used. When film formation is performed by use of the sputtering method, film formation is performed by sputtering a carbon target formed of graphite or the like in an inert gas such as argon.

In the above explanation, the variable resistance layer 114 is formed of a carbon film, but the same effect can be attained if a material containing carbon is used. For example, a steric structure of carbon containing a carbon nano-material, graphite, amorphous carbon or a mixture thereof can be used.

Next, a titanium nitride film of 10 nm and tungsten film of 50 nm are laminated and deposited by use of the sputtering method in order to form a top electrode 116. In this embodiment, titanium nitride and tungsten are used as examples, but other conductive metals can be used.

Next, as shown in FIG. 7B, the layers 116 to 113 are processed into electrode shapes by use of a known lithography technique and reactive ion-etching technique. Subsequently, as shown in FIG. 7C, a silicon oxide film is formed as an interlayer insulating film 117 and then pads 118 connected to the bottom electrode 112 and top electrode 116 are formed.

Peeling tests were performed for the variable resistance element thus formed based on a tape test described in Japanese Industrial Standard (JIS) K5400 8.5. As a result, it is found that the variable resistance layer 114 is completely peeled off after the tape test if a nitrogen-doped carbon film acting as the buffer layer 113 is not provided. On the other hand, the variable resistance layer 114 is not separated if the buffer layer 113 is provided and it is not separated even in a later step.

Further, a sample of the variable resistance element was cleaved and the cross section thereof was checked by use of a scanning electron microscope (SEM). As a result, it is understood that local gaps are formed between the bottom electrode 112 and the variable resistance layer 114 if a nitrogen-doped carbon film acting as the buffer layer 113 is not provided. On the other hand, if the buffer layer 113 is provided, the bottom electrode 112 and variable resistance layer 114 are closely bonded and the bonded surfaces are not separated even in a later step or when an additional thermal treatment is performed. Thus, in order to attain and maintain a good characteristic of the element operation, it is absolutely necessary not to form gaps, and the quality can be confirmed by observing the cross section by use of SEM.

Figure 10:
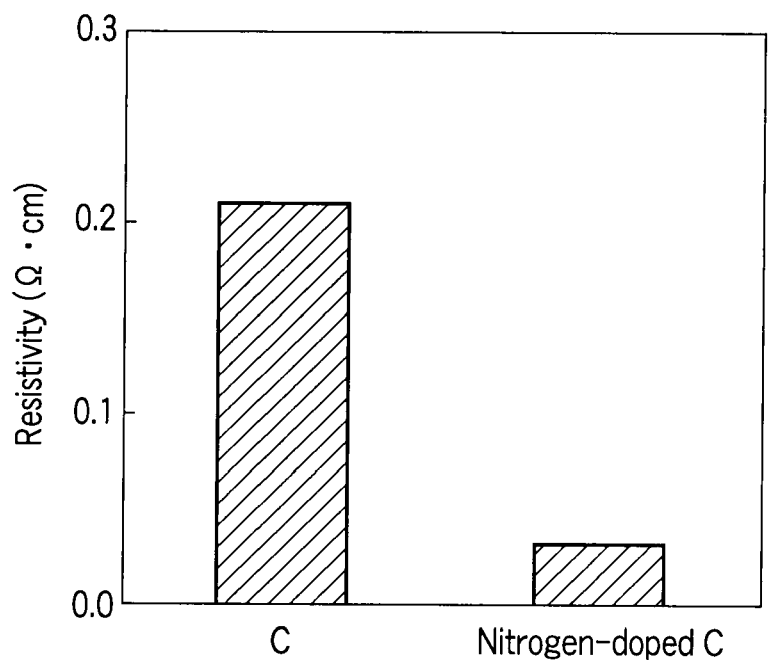
FIG. 10 is a diagram showing the results of measurement tests for electrical resistivity of a nitrogen-doped carbon film and carbon film.

FIG. 10 shows the results of measurement tests for electrical resistivity of the nitrogen-doped carbon film acting as the buffer layer 113 and the carbon film acting as the variable resistance layer 114. The electrical resistivity of the nitrogen-doped carbon film is lower by one figure in comparison with that of the carbon film. Therefore, a voltage applied between the electrodes 112 and 116 can be efficiently applied to the variable resistance layer 114 without significantly attenuating the same in the buffer layer 113. Further, a voltage applied to the carbon film used as the variable resistance layer 114 can be adjusted by changing the film thickness ratio of the nitrogen-doped carbon film and the carbon film.

Figure 11:
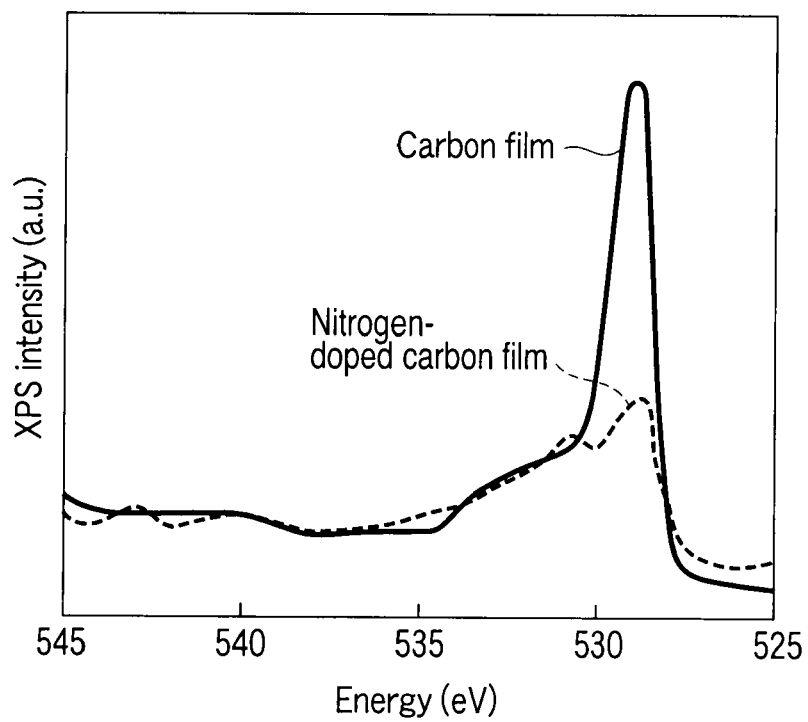
FIG. 11 is a diagram showing the results of XPS measurement tests when a nitrogen-doped carbon film is formed under a carbon film and when the former film is not formed on the latter film.

FIG. 11 shows the results of X-ray photoelectron spectroscopy (XPS) measurement tests (O1s spectra) for the nitrogen-doped carbon film acting as the buffer layer 113 and the carbon film acting as the variable resistance layer 114.

In FIG. 11, the solid line indicates a case wherein only the carbon film is formed and the nitrogen-doped carbon film is not formed and dotted lines indicate a case wherein the carbon film is formed via the nitrogen-doped carbon film.

A nitrogen-doped carbon film and carbon film are deposited to 2 nm on a bottom titanium nitride electrode. The bottom electrode of titanium nitride is analyzed through the nitrogen-doped carbon film or carbon film with 2 nm film thickness since XPS signal is attenuated when the film is formed thick. The O1s XPS intensity corresponds to an amount of oxygen atoms present on the surface and in a region within attenuation length of photoelectron, approximately 10 nm or less. When a carbon film is formed via a nitrogen-doped carbon film, the O1s XPS intensity is reduced in comparison with a case wherein the carbon film is directly formed. As a result, it is proved that metal-oxide layer formed on the bottom electrode can be reduced when a carbon film is formed via a nitrogen-doped carbon film. Likewise, in an evaluation method using an Energy Dispersive X-ray Spectroscopy (EDX) for a wafer after it is cleaved and the cross section thereof is exposed, it can be also confirmed that a signal of oxygen in the bottom electrode portion is reduced.

With the configuration of the first embodiment, samples with the nitrogen composition of the nitrogen-doped carbon film set to 0, 10, 30, 40 atomic % and the diameter of the variable resistance portion changed in an order of 30, 2, 0.2, 0.1, 0.05 μmφ are formed and the switching characteristics thereof are evaluated. Preferable switching characteristics can be attained in cases other than a case wherein the diameter of the variable resistance portion is large and the nitrogen-doped carbon buffer film is not provided as shown in the following Table 1.

TABLE 1

| Nitrogen composition [atomic %] | Diameter of variable resistance portion [μmφ] | SW characteristic |
| --- | --- | --- |
| 0 | 30 | NG |
| 10 | 30 | NG |
| 30 | 30 | NG |
| 40 | 30 | NG |
| 0 | 2 | NG |
| 10 | 2 | Good |
| 30 | 2 | Good |
| 40 | 2 | Good |
| 0 | 0.2 | NG |
| 10 | 0.2 | Good |
| 30 | 0.2 | Good |
| 40 | 0.2 | Good |
| 0 | 0.1 | NG |
| 10 | 0.1 | Good |
| 30 | 0.1 | Good |
| 40 | 0.1 | Good |
| 0 | 0.05 | NG |
| 10 | 0.05 | Good |
| 30 | 0.05 | Good |
| 40 | 0.05 | Good |

In Table 1, "NG" indicates that the normal switching operation cannot be performed and "Good" indicates that set/reset resistance and voltage can be attained. When the diameter of the variable resistance portion is large, that is, the element area is large, the element tends to be influenced by defects and it is difficult to perform the switching operation. As the element area becomes smaller, the probability of the operation becomes higher. However, when the nitrogen component is 0%, that is, a nitrogen-doped carbon film is not provided, the element tends to be influenced by deterioration in adhesion and it is difficult to perform the switching operation.

As explained above, by disposing the nitrogen-doped carbon film, that is, the buffer layer 113 between the carbon film that is the variable resistance film 114 and the bottom electrode 112, a reaction between the above films can be suppressed. As a result, separation can be physically suppressed and a variable resistance characteristic that is electrically stable can be realized.

Thus, according to this embodiment, even in the case of a carbon film having high absorbency and weak adhesion, the adhesion between the carbon related material and the electrode can be prevented from being lowered and the variable resistance characteristic can be suppressed from becoming unstable. Further, since the composition thereof can be easily controlled in comparison with a multi-component oxide material, memory cells can be relatively easily formed. Therefore, as a next-generation technique for further enhancing the recording density of the present nonvolatile flash memory, significant merits in industry can be obtained.

(Modification)

This invention is not limited to the above examples and embodiments and can be embodied by various modifying the constituents without departing from the technical scope thereof. Further, various inventions can be made by adequately combining a plurality of constituents disclosed in the above embodiments. For example, some constituents may be omitted from all of the constituents disclosed in the above embodiments and the constituents of the different embodiments may be adequately combined.

The variable resistance layer is not necessarily formed of a single carbon layer and may be formed of a film containing carbon as a main component. Likewise, the buffer layer is not necessarily formed of a nitrogen-doped carbon film and may be formed of a film having nitrogen doped therein and containing carbon as a main component.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
   bottom electrodes formed above a substrate, each of the bottom electrodes having an oxygen concentration not more than 30 atomic % and more than 0 atomic %;
   first buffer layers formed on the bottom electrodes, each of the first buffer layers being formed of a film containing nitrogen and containing carbon as a main component;
   variable resistance films formed on the first buffer layers, each of the variable resistance films being formed of a film containing carbon as a main component and an electrical resistivity of each of the variable resistance films being changed according to one of application of voltage or supply of current; and
   top electrodes formed on the variable resistance films.

2. The nonvolatile semiconductor memory according to claim 1, further comprising second buffer layers each formed of a film containing nitrogen and containing carbon as a main component and disposed between the variable resistance films and the top electrodes.

3. The nonvolatile semiconductor memory according to claim 2, wherein each of the second buffer layers is a carbon nitride layer.

4. The nonvolatile semiconductor memory according to claim 1, wherein each of the bottom and top electrodes is formed of one component selected from the group consisting of titanium, zirconium, hafnium, tantalum, tungsten, aluminum, silicon and a nitride thereof.

5. The nonvolatile semiconductor memory according to claim 1, wherein each of the first buffer layers is a carbon nitride layer.

6. The nonvolatile semiconductor memory according to claim 5, wherein a nitrogen in the first buffer layers is contained not less than 10 atomic % and is not more than 50 atomic %.

7. The nonvolatile semiconductor memory according to claim 5, wherein nitrogen in the first buffer layers is contained in an amount not less than 10 atomic % and is not more than 40 atomic %.

8. The nonvolatile semiconductor memory according to claim 5, wherein carbon in the first buffer layers is contained in an amount more than 50 atomic % and less than 90%.

9. The nonvolatile semiconductor memory according to claim 1, wherein a film thickness of each of the first buffer layers is set to not less than 2 nm and not more than 10 nm.

10. The nonvolatile semiconductor memory according to claim 1, wherein a film thickness of each of the variable resistance films is set to not less than 20 nm and not more than 100 nm.

11. The nonvolatile semiconductor memory according to claim 1, wherein each of the variable resistance films is formed of one component selected from the group consisting of a steric structure of carbon containing graphite, amorphous carbon, carbon nanotube, fullerene, and a mixture of these foregoing materials.

12. A nonvolatile semiconductor storage device comprising:
a plurality of memory cells each arranged at an intersection between a first wiring and a second wiring, each of the memory cells including a bottom electrode having an oxygen concentration not more than 30 atomic % and more than 0 atomic %, a buffer layer containing nitrogen and containing carbon as a main component formed on the bottom electrode, a variable resistance film containing carbon as a main component formed on the buffer layer and a top electrode formed on the variable resistance film.

13. The nonvolatile semiconductor storage device according to claim 12, further comprising a non ohmic element disposed between the first wiring and the bottom electrode or between the top electrode and the second wiring.

* * * * *